(12) United States Patent
Chang et al.

(10) Patent No.: US 12,740,365 B2
(45) Date of Patent: Sep. 15, 2026

(54) WAFER HOLDER DEVICE HAVING HEATING FUNCTION

(71) Applicant: SKY TECH INC., Hsinchu County (TW)

(72) Inventors: Jung-Hua Chang, Hsinchu County (TW); Ta-Hao Kuo, Hsinchu County (TW)

(73) Assignee: SKY TECH INC., Hsinchu County (TW)

( * ) Notice: Subject to any disclaimer, the term of this patent is extended or adjusted under 35 U.S.C. 154(b) by 275 days.

(21) Appl. No.: 18/413,947

(22) Filed: Jan. 16, 2024

(65) Prior Publication Data

US 2025/0232989 A1 Jul. 17, 2025

(51) Int. Cl.
*H10P 72/00* (2026.01)
*H10P 72/78* (2026.01)

(52) U.S. Cl.
CPC .......... *H10P 72/0432* (2026.01); *H10P 72/78* (2026.01)

(58) Field of Classification Search
CPC ... H10P 72/7624; H10P 72/0482; H10P 72/78
See application file for complete search history.

(56) References Cited

U.S. PATENT DOCUMENTS 3,783,822 A * 1/1974 Wollam ............ H01L 21/68764 118/725
5,273,588 A * 12/1993 Foster ............... H01L 21/67103 118/715
5,300,175 A * 4/1994 Gardner .............. H01L 21/6838 156/286
5,370,739 A * 12/1994 Foster ............... C23C 16/45565 118/727
5,376,213 A * 12/1994 Ueda ................... H10P 72/0441 156/345.53
5,558,717 A * 9/1996 Zhao ................ C23C 16/45502 118/728
6,007,635 A * 12/1999 Mahawili .......... H01L 21/68785 156/345.52
6,530,994 B1 * 3/2003 Mahawili ............ H10P 72/0436 156/345.52
9,785,055 B2 * 10/2017 Laurent ............... G03F 7/70341
10,008,399 B2 * 6/2018 Parkhe .............. H01L 21/67103
10,008,404 B2 * 6/2018 Parkhe .............. H01L 21/67103
12,500,071 B2 * 12/2025 Kuno ................ H01J 37/32724
12,512,358 B2 * 12/2025 Chadha ................. H10P 72/722
2002/0000547 A1 * 1/2002 Yamaguchi ....... H01L 21/68757 257/4

(Continued)

*Primary Examiner* — Jason L Vaughan
(74) *Attorney, Agent, or Firm* — HDLS IPR SERVICES; Chun-Ming Shih

(57) ABSTRACT

A wafer holder device having a heating function includes a fixing ring, a holder plate, and a heating plate. The fixing ring surrounds a hollow area, and the fixing ring includes a top and a bottom. The hollow area connects the top and the bottom. The holder plate includes a holding surface and a bottom surface. The holder plate is removably fixed to the top of the fixing ring, and the bottom surface of the holder plate covers the hollow area. A coefficient of thermal expansion of the holder plate is smaller than a coefficient of thermal expansion of the fixing ring. The heating plate is provided within the hollow area for heating the bottom surface of the holder.

10 Claims, 7 Drawing Sheets

(56) References Cited

U.S. PATENT DOCUMENTS

2007/0126457 A1* 6/2007 Natsuhara .......... G01R 31/2893
324/754.03
2009/0280248 A1* 11/2009 Goodman ........... C23C 16/4581
118/728
2012/0037068 A1* 2/2012 Su ....................... F27B 17/0025
219/385
2017/0186634 A1* 6/2017 Yanagisawa ........ H10P 72/0464
2023/0357954 A1* 11/2023 Tsukui .................. C30B 29/403
2025/0118586 A1* 4/2025 Chadha ............... H01L 21/6833

* cited by examiner

WAFER HOLDER DEVICE HAVING HEATING FUNCTION

BACKGROUND

Technical Field

This disclosure relates to a wafer holder plate, and more particular to a wafer holder device having a heating function.

Related Art

A wafer has to be firmly fixed to a plane during processing, so that all wafer manufacturing processes can be carried out accurately. The aforementioned processes include, but are not limited to, thin film deposition, wafer thinning, exposure and etching.

In the related art, a wafer in processing is carried by a holder plate. The holder plate has a holding surface for holding the wafer. The holding surface is provided with a vent hole, and negative pressure is applied to the vent hole by a vacuum pump, so that the holder plate can attract the wafer by the negative pressure, and the wafer is firmly fixed on the holding surface.

The aforementioned processes usually involve heating the wafer to allow a temperature of the wafer to meet a necessary temperature condition. In an existing heating technology, a heating device is used to heat the holder plate, and the wafer is evenly heated after a temperature equalization effect is achieved through the holder plate.

The holder plate will also expand thermally when heated. If the thermal expansion of the holder plate is excessive, a contact state between the holder plate and the attracted wafer will be changed, which will have an adverse impact on the wafer manufacturing process. For example, the total thickness variation (TTV) is poor or a back plating phenomenon occurs in an ALD process.

Therefore, in the related art, the holder plate is usually integrally made of metal with a low coefficient of thermal expansion, so as to avoid excessive thermal expansion. The common metal with the low coefficient of thermal expansion is a titanium alloy. However, the titanium alloy is high in material cost and difficult to process, which often increases the manufacturing cost of the holder plate.

SUMMARY

In view of the above technical problems, this disclosure provides a wafer holder device having a heating function, which can effectively avoid the wafer processing problem caused by the excessive thermal expansion of the holder plate and maintain low manufacturing cost of the wafer holder device.

At least an embodiment of this disclosure provides a wafer holder device having a heating function, including a fixing ring, a holder plate, and a heating plate. The fixing ring surrounds a hollow area, and the fixing ring includes a top and a bottom. The hollow area connects the top and the bottom. The holder plate includes a holding surface and a bottom surface, the holder plate is removably fixed to the top of the fixing ring, and the bottom surface of the holder plate covers the hollow area. A coefficient of thermal expansion of the holder plate is smaller than a coefficient of thermal expansion of the fixing ring. The heating plate is provided within the hollow area for heating the bottom surface of the holder plate.

In at least one embodiment, a linear coefficient of thermal expansion of the coefficient of thermal expansion of the holder plate is smaller than 15×10−6/° C.

In at least one embodiment, the wafer holder device further includes a flexible thermal conductive medium clamped between the bottom surface of the holder plate and the heating plate.

In at least one embodiment, a shallow trough is formed in the bottom surface of the holder plate, and the flexible thermal conductive medium is filled in the shallow trough.

In at least one embodiment, the shallow trough is located in a center of the bottom surface.

In at least one embodiment, a gas channel is formed inside the holder plate, the holder plate is provided with an air suction port, the gas channel connects the holding surface and the air suction port, and the gas channel is provided with a plurality of ventilation openings formed in the holding surface.

In at least one embodiment, the holder plate further includes a plurality of air guide trenches, and the air guide trenches extend on the holding surface and extend to at least one of the ventilation openings.

In at least one embodiment, the air suction port is located on a lateral surface of the holder plate.

In at least one embodiment, the wafer holder device further includes a fixing plate and a fixing member; the fixing plate is configured to hold the heating plate, and the fixing member is combined with an edge of the fixing plate to support the heating plate.

In at least one embodiment, the wafer holder device further includes a thermal insulation block combined with the bottom of the fixing ring, and the fixing member is fixed to the thermal insulation block.

Through the wafer holder device provided by this disclosure, the holder plate can maintain a configuration with the low coefficient of thermal expansion, so as to avoid adverse effects on wafers during wafer processing. The wafer holder device is composed of a plurality of different components, and materials with lower cost can be selected for components other than the holder plate, thereby reducing the overall manufacturing cost of the wafer holder device.

BRIEF DESCRIPTION OF THE DRAWINGS

This disclosure will become more fully understood from the detailed description given herein below for illustration only, and thus not limitative of this disclosure; wherein.

DETAILED DESCRIPTION

Figure 1:
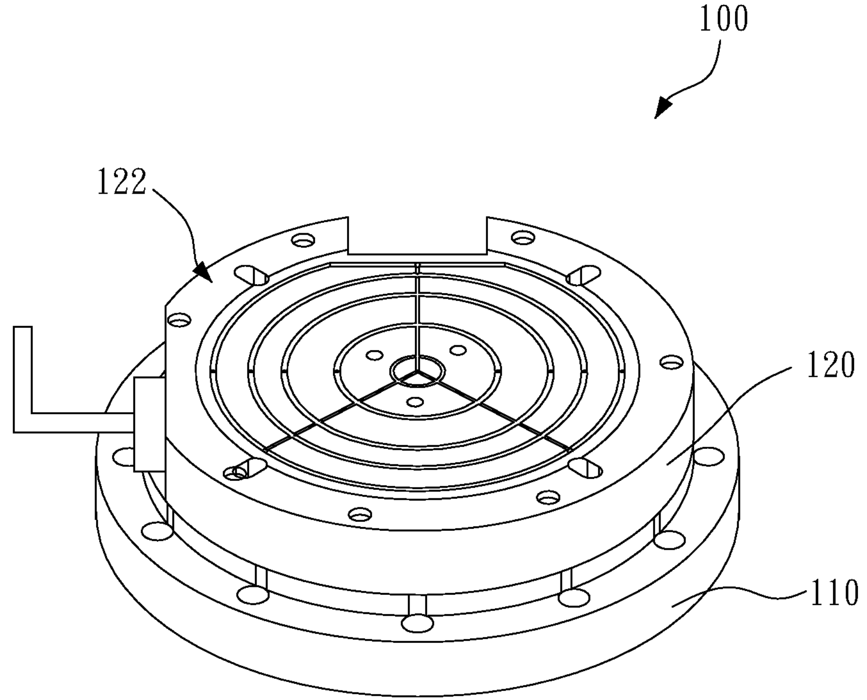
FIG. 1 is a perspective view of this disclosure.
Figure 2:
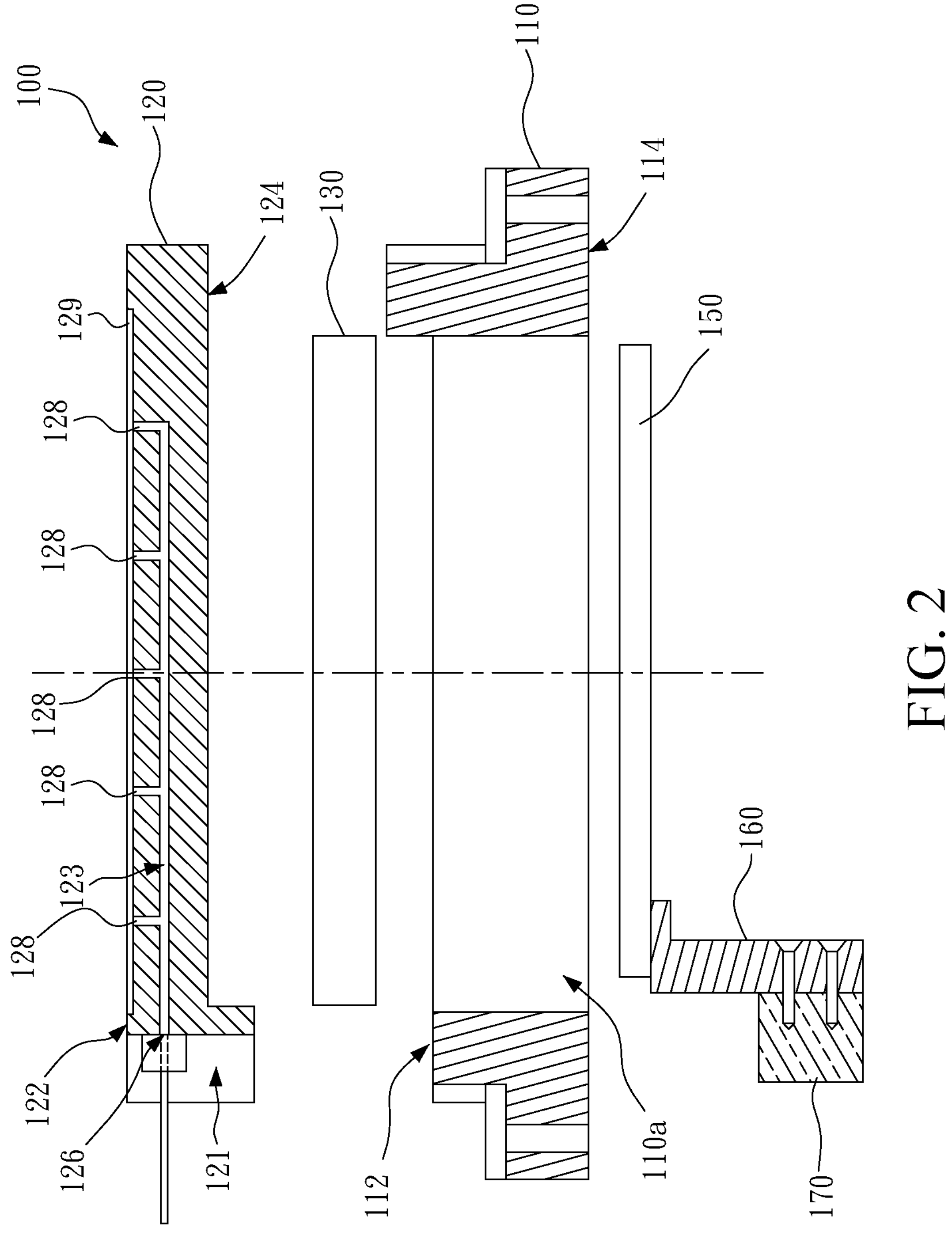
FIG. 2 is a side exploded view of an embodiment of this disclosure, with some components shown in cross-sectional view.
Figure 3:
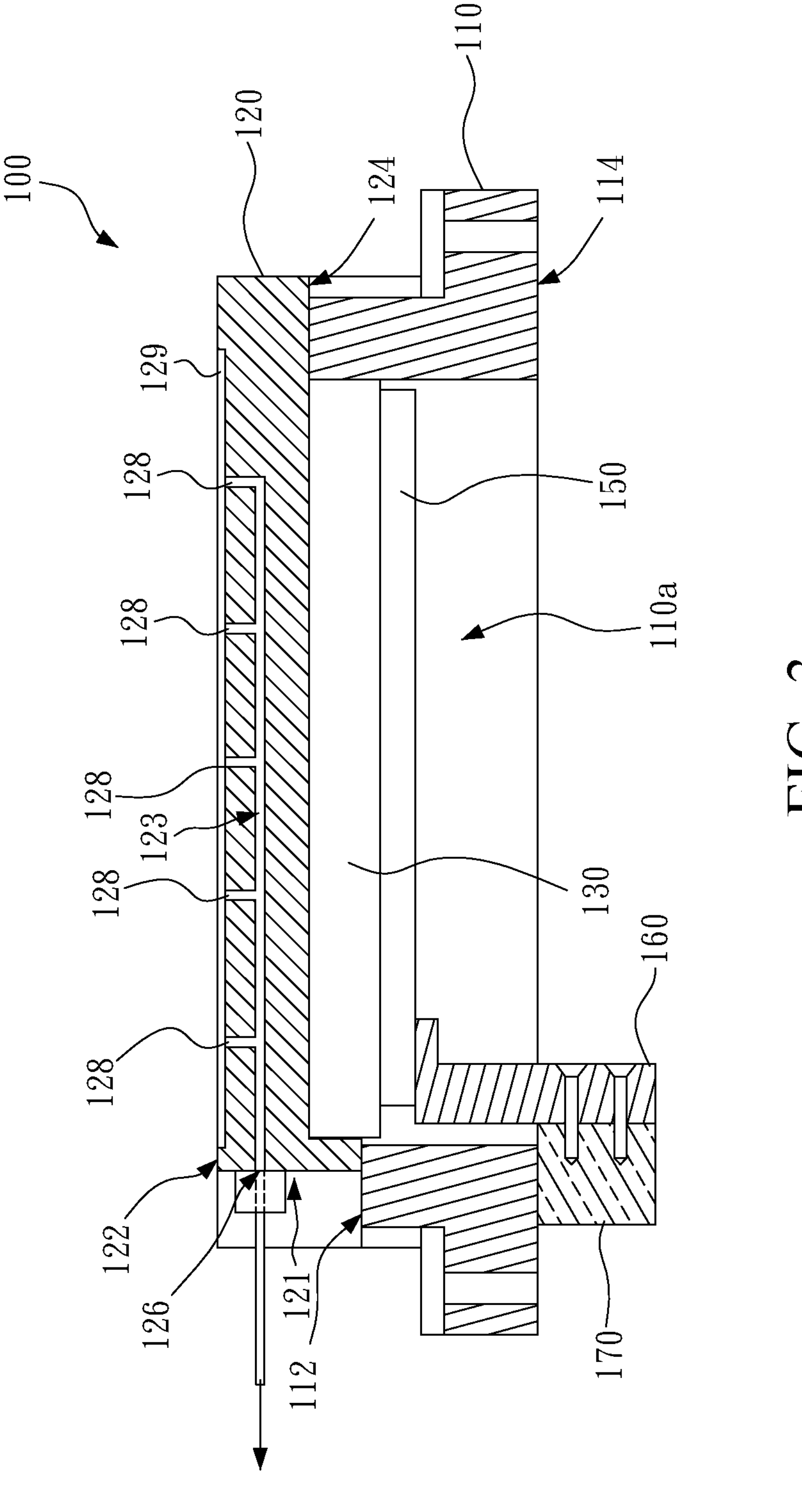
FIG. 3 is a side view of an embodiment of this disclosure, with some components shown in cross-sectional view.
Figure 4:
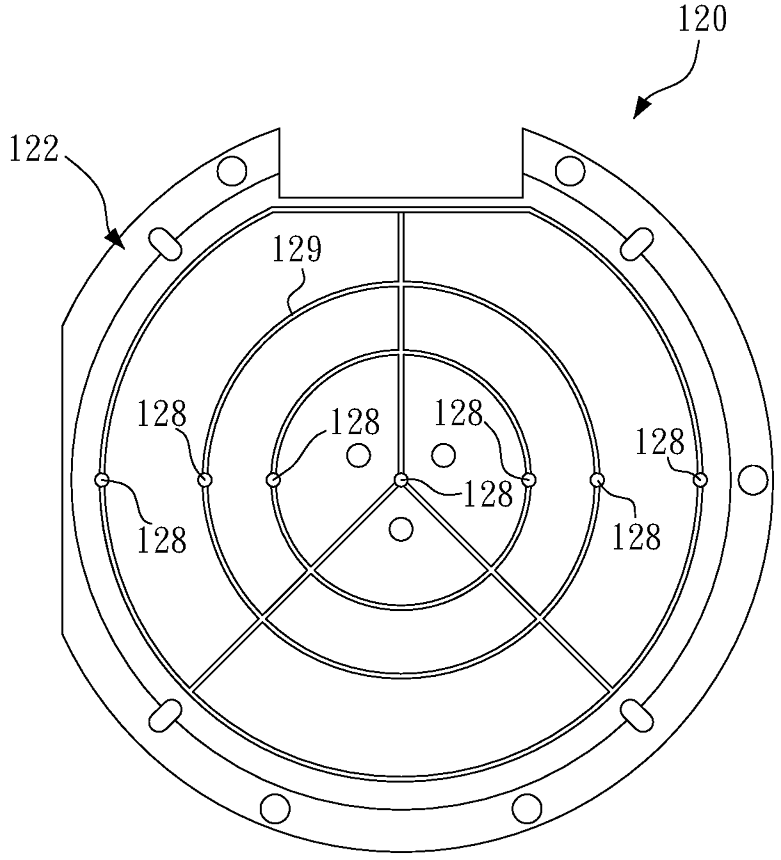
FIG. 4 is a top view of a holder plate in an embodiment of this disclosure.

Referring to FIG. 1, FIG. 2 and FIG. 3, a wafer holder device 100 having a heating function disclosed in an embodiment of this disclosure is shown as being provided on wafer processing equipment. The wafer holder device 100 is configured to fix a wafer thereon and heat the wafer. The wafer processing equipment can be but is not limited to ALD (Atomic Layer Deposition equipment) and wafer thinning equipment. As shown in FIG. 1 to FIG. 4, the wafer holder device 100 includes a fixing ring 110, a holder plate 120 and a heating plate 130.

As shown in FIG. 1 to FIG. 4, the fixing ring 110 surrounds a hollow area 110*a*. The fixing ring 110 includes a top 112 and a bottom 114. The hollow area 110*a* connects the top 112 and the bottom 114.

As shown in FIG. 1 to FIG. 3, the holder plate 120 includes a holding surface 122 and a bottom surface 124. The holding surface 122 is configured to hold a wafer thereon. The holder plate 120 is removably fixed to the top 112 of the fixing ring 110, and the bottom surface 124 of the holder plate covers the hollow area 110*a*. A coefficient of thermal expansion of the holder plate 120 is smaller than a coefficient of thermal expansion of the fixing ring 110. The heating plate 130 is provided within the hollow area 110*a*, and is configured to heat the bottom surface 124, so that an overall temperature of the holder plate 120 rises, thereby heating the wafer.

As shown in FIG. 1 to FIG. 4, the holder plate 120 can not only hold the wafer, but also fix the wafer onto the holding surface 122. A gas channel 123 is formed inside the holder plate 120, the holder plate 120 is provided with an air suction port 126, and the gas channel 123 connects with the holding surface 122 and the air suction port 126. The gas channel 123 is provided with a plurality of ventilation openings 128 formed in the holding surface 122. Moreover, the holder plate 120 further includes a plurality of air guide trenches 129, and the air guide trenches 129 extend on the holding surface 122 and extend to at least one of the ventilation openings 128. The air suction port 126 is located on a lateral surface 121 of the holder plate 120. The air suction port 126 is configured to be connected to a vacuum pump. After the vacuum pump is started to evacuate air, negative pressure can be generated through the ventilation openings 128 and the air guide trench 129, to attract the wafer and fix the wafer onto the holding surface 122.

When the heating plate 130 heats, the fixing ring 110 and the holder plate 120 inevitably expand thermally, and a contact state between the holder plate 120 and the wafer is changed, thus adversely affecting a wafer processing process. For example, the total thickness variation (TTV) is poor or a back plating phenomenon occurs in an ALD process.

Therefore, in one specific embodiment, the holder plate 120 is made of a material with a low coefficient of thermal expansion. In an embodiment, the material with the low coefficient of thermal expansion is made of titanium metal or titanium alloy and its linear coefficient of thermal expansion is less than 15×10−6/° C. Therefore, the degree of thermal expansion of the holder plate 120 under a heated condition is reduced as much as possible, thereby preventing the contact state between the holder plate 120 and the wafer from being changed excessively and causing adverse effects on the wafer processing process. The fixing ring 110 can be made of traditional high-rigidity materials, for example, SUS304 or aluminum metal. The fixing ring 110 can be made of a material with lower cost, and only the holder plate 120 is made of a material with higher cost (for example, titanium metal or titanium alloy), so that the manufacturing cost of the wafer holder device 100 can be controlled as a whole.

As shown in FIG. 1 to FIG. 3, moreover, the wafer holder device 100 further includes a fixing plate 150 and a fixing member 160; the fixing plate 150 is configured to hold the heating plate 130, and the fixing member 160 is combined with an edge of the fixing plate 150 to support the heating plate 130. In order to further fix the heating plate 130 to the fixing ring 110, the wafer holder device 100 further includes an thermal insulation block 170 combined with the bottom 114 of the fixing ring 110, and the fixing member 160 is fixed to the thermal insulation block 170, thereby indirectly fixing the heating plate 130 to the bottom 114 of the fixing ring 110.

Figure 5:
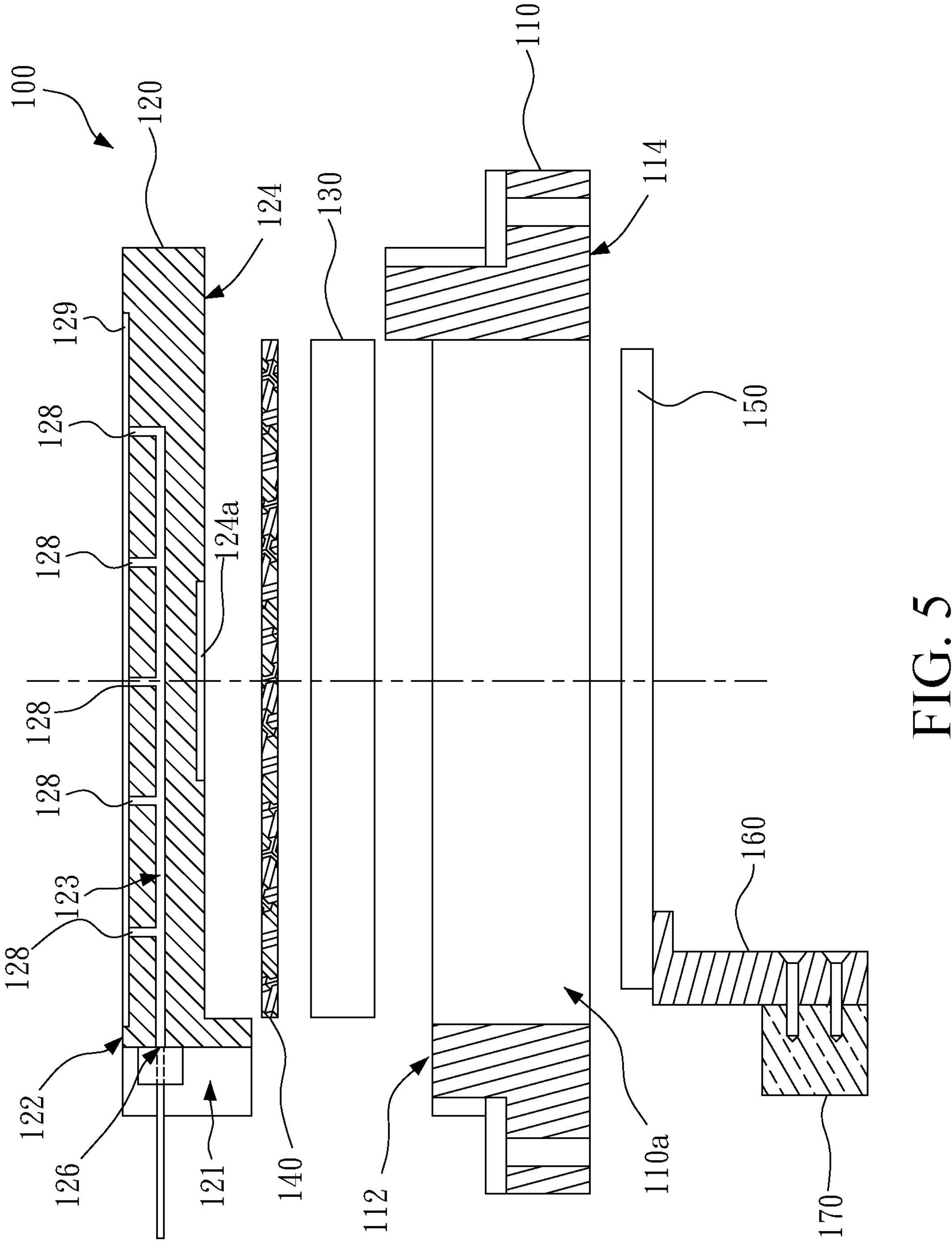
FIG. 5 is a side exploded view of another embodiment of this disclosure, with some components shown in cross-sectional view.
Figure 6:
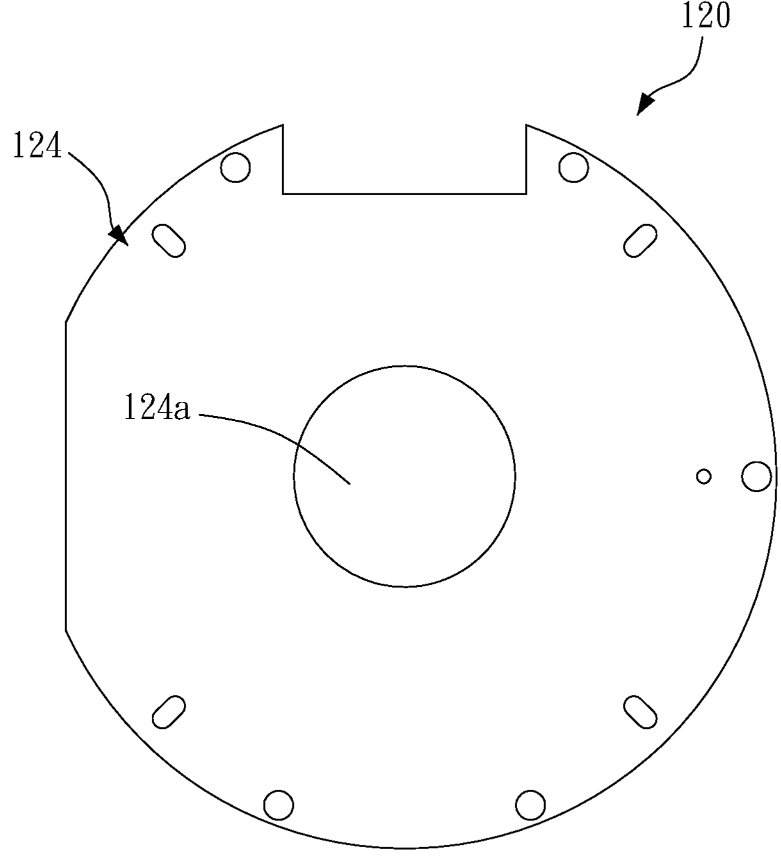
FIG. 6 is a bottom view of the holder plate of the embodiment of this disclosure.
Figure 7:
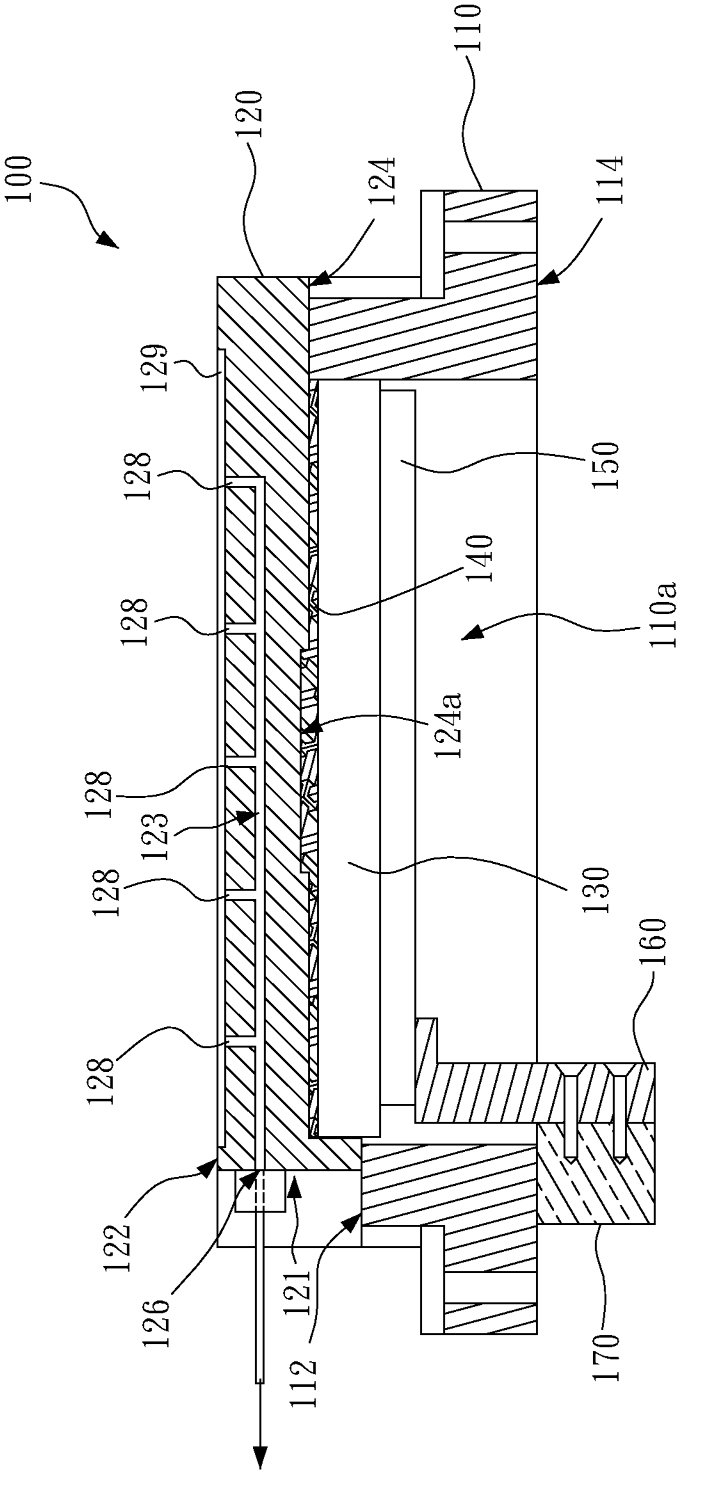
FIG. 7 is a side view of an embodiment of this disclosure, with some components shown in cross-sectional view.

As shown in FIG. 5, FIG. 6 and FIG. 7, the wafer holder device 100 according to an embodiment of this disclosure is shown. In order to improve thermal conduction between the heating plate 130 and the holder plate 120, and prevent a gap with poor contact from reducing a local or average coefficient of thermal conductivity, the wafer holder device 100 further includes a flexible thermal conductive medium 140 clamped between the bottom surface 124 of the holder plate 120 and the heating plate 130. In a preferred embodiment, the flexible thermal conductive medium 140 is a graphite sheet, but the implementation of the flexible thermal conductive medium 140 does not exclude thermal conducting paste, a metal foil or other implementations that are easily deformed and have high coefficient of thermal conductivity.

Moreover, when the bottom surface 124 of the holder plate 120 is directly or indirectly covered by the heating plate 130, a temperature in a center of the holder plate 120 is usually higher than an ambient temperature, which affects an average temperature on the holder plate 120, resulting in uneven temperature distribution on the wafer surface and inconsistent conditions for coating, deposition and other operations. Accordingly, in this disclosure, a shallow trough 124*a* is formed in the bottom surface 124 of the holder plate 120, and the shallow trough 124*a* is roughly located in a center of the bottom surface 124. When the flexible thermal conductive medium 140 is clamped between the bottom surface 124 of the holder plate 120 and the heating plate 130, the flexible thermal conductive medium 140 will be filled in the shallow trough 124*a*.

At this time, the flexible thermal conductive medium 140 in the shallow trough 124*a* has a relatively large thickness, that is, a distance between a portion of the bottom surface 124 located in the shallow trough 124*a* and the heating plate 130 is greater than a distance between other portions of the bottom surface 124 and the heating plate 130, and a local thermal resistance is enhanced accordingly, so that there will be no too big temperature difference between the temperature of the portion of the holder plate 120 and the temperatures of other portions of the holder plate. Therefore, the temperature distribution on the wafer surface will become more uniform, so that temperature conditions of coating, deposition and other operations on the wafer surface are consistent.

Specifically, the thermal insulation block 170 is made of a material with a low coefficient of thermal conductivity, such as ceramics. The thermal insulation block 170 is configured to reduce thermal power conducted by the heating plate 130 to the fixing ring 110 through the fixing plate 150 and the fixing member 160. Therefore, for a heating path of the fixing ring 110, only a portion of the top 112 of the fixing ring 110 is in contact with the holder plate 120, thereby reducing the heating degree of the fixing ring 110 and reducing the thermal expansion of the fixing ring 110.

Through the wafer holder device 100 provided by this disclosure, the holder plate 120 can maintain a configuration with the low coefficient of thermal expansion, so as to avoid adverse effects on wafers during wafer processing. The wafer holder device 100 is composed of a plurality of different components, and materials with lower cost can be selected for components other than the holder plate 120, thereby reducing the overall manufacturing cost of the wafer holder device 100.

What is claimed is:

1. A wafer holder device having a heating function, comprising:

a fixing ring surrounding a hollow area and having a top and a bottom; wherein the hollow area connects the top and the bottom;

a holder plate having a holding surface and a bottom surface;

wherein the holder plate is removably fixed to the top of the fixing ring and the bottom surface of the holder plate covers the hollow area;

wherein a coefficient of thermal expansion of the holder plate is smaller than a coefficient of thermal expansion of the fixing ring; and a heating plate provided within the hollow area for heating the bottom surface of the holder plate.

2. The wafer holder device according to claim 1, wherein a linear coefficient of thermal expansion of the coefficient of thermal expansion of the holder plate is smaller than 15×10-6/° C.

3. The wafer holder device according to claim 2, wherein a shallow trough is formed in the bottom surface of the holder plate, and the flexible thermal conductive medium is filled in the shallow trough.

4. The wafer holder device according to claim 1, further comprising a flexible thermal conductive medium clamped between the bottom surface of the holder plate and the heating plate.

5. The wafer holder device according to claim 4, wherein the shallow trough is located in a center of the bottom surface.

6. The wafer holder device according to claim 1, wherein a gas channel is formed inside the holder plate, the holder plate is provided with an air suction port, the gas channel connects the holding surface and the air suction port, and the gas channel is provided with a plurality of ventilation openings formed in the holding surface.

7. The wafer holder device according to claim 6, wherein the holder plate further comprises a plurality of air guide trenches, and the air guide trenches extend on the holding surface and extend to at least to one of the ventilation openings.

8. The wafer holder device according to claim 7, wherein the air suction port is located on a lateral surface of the holder plate.

9. The wafer holder device according to claim 1, the wafer holder device further comprises a fixing plate and a fixing member, wherein the fixing plate is configured to hold the heating plate, and the fixing member is combined with an edge of the fixing plate to support the heating plate.

10. The wafer holder device according to claim 9, the wafer holder device further comprises a thermal insulation block combined with the bottom of the fixing ring, and the fixing member is fixed to the thermal insulation block.

* * * * *